United States Patent
Nagayama et al.

(10) Patent No.: US 11,349,634 B2
(45) Date of Patent: May 31, 2022

(54) CYCLE ESTIMATION DEVICE FOR PULSE TRAIN SIGNAL, CYCLE ESTIMATION METHOD FOR PULSE TRAIN SIGNAL, AND CYCLE ESTIMATION PROGRAM FOR PULSE TRAIN SIGNAL

(71) Applicant: NIPPON TELEGRAPH AND TELEPHONE CORPORATION, Tokyo (JP)

(72) Inventors: Hiroki Nagayama, Musashino (JP); Shingo Kashima, Musashino (JP); Masaki Tanikawa, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/425,328

(22) PCT Filed: Feb. 20, 2020

(86) PCT No.: PCT/JP2020/006855
§ 371 (c)(1),
(2) Date: Jul. 23, 2021

(87) PCT Pub. No.: WO2020/184141
PCT Pub. Date: Sep. 17, 2020

(65) Prior Publication Data
US 2022/0103336 A1      Mar. 31, 2022

(30) Foreign Application Priority Data
Mar. 8, 2019 (JP) .............................. JP2019-043210

(51) Int. Cl.
*H04L 7/00* (2006.01)

(52) U.S. Cl.
CPC .................................. *H04L 7/0087* (2013.01)

(58) Field of Classification Search
CPC ............................. H04L 7/0087; G01S 13/22
See application file for complete search history.

(56) References Cited

U.S. PATENT DOCUMENTS

| 4,209,775 A | * | 6/1980 | Kawashima | .......... | H03M 1/504 |
| | | | | | 341/145 |
| 4,400,695 A | * | 8/1983 | Rittenbach | .......... | G08B 13/126 |
| | | | | | 367/136 |

(Continued)

OTHER PUBLICATIONS

Nishiguchi, Kenichi et al., "Improved Algorithm for Estimating Pulse Repetition Intervals", IEEE Transaction on Aerospace and Electronic Systems, vol. 36, Issue: 2, IEEE [online], Apr. 2000 [retrieved on May 15, 2020], pp. 407-421, Retrieved from the Internet: <URL: https://ieeexplore. IEEE.org/document/845217>.

*Primary Examiner* — Freshteh N Aghdam
(74) *Attorney, Agent, or Firm* — Xsensus LLP

(57) ABSTRACT

A cycle estimation device (10) includes: a candidate cycle extraction unit (11) which extracts a candidate cycle that is a cycle determination target from an input time-series pulse train; a pulse train shape analysis unit (12) which converts arrangement of the time-series pulse train into numerical values on the basis of the extracted candidate cycle and outputs a constant that adjusts a random noise threshold value of pulse repetition interval (PRI) conversion in response to an index indicating a degree of concentration of calculated numerical values; and a cycle detection unit (13) which executes PRI conversion using a value of the candidate cycle and the constant and performs cycle determination and cycle value detection.

6 Claims, 4 Drawing Sheets

(56) References Cited

U.S. PATENT DOCUMENTS

| | | | |
|---|---|---|---|
| 2008/0192864 A1* | 8/2008 | Szajnowski | G01S 7/021 375/340 |
| 2012/0293363 A1* | 11/2012 | Song | G01S 7/021 342/195 |
| 2018/0120380 A1* | 5/2018 | Giussani | G01R 31/42 |

* cited by examiner

CYCLE ESTIMATION DEVICE FOR PULSE TRAIN SIGNAL, CYCLE ESTIMATION METHOD FOR PULSE TRAIN SIGNAL, AND CYCLE ESTIMATION PROGRAM FOR PULSE TRAIN SIGNAL

CROSS-REFERENCE TO RELATED APPLICATIONS

The present application is based on PCT filing PCT/JP2020/006855, filed Feb. 20, 2020, which claims priority to JP 2019-043210, filed Mar. 8, 2019, the entire contents of each are incorporated herein by reference.

TECHNICAL FIELD

The present invention relates to a pulse train signal cycle estimation device, a pulse train signal cycle estimation method, and a pulse train signal cycle estimation program.

BACKGROUND ART

As a typical method for estimating a cycle of a pulse train signal, a method such as pulse repetition interval (PRI) conversion of performing conversion similar to autocorrelation is present. In PRI conversion, when an input pulse train is arranged at certain intervals, it is possible to determine whether the pulse train is a periodic pulse train or incidental formation of pulses at an equal interval from a part of random noise by setting a random noise threshold value in proportion to a total number of pulses and prevent erroneous extraction of a non-existing cycle from the random noise.

CITATION LIST

Non Patent Literature

[NPL 1] KEN'ICHI, N. et al., "Improved algorithm for Estimating Pulse Repetition Intervals", IEEE Transactions on Aerospace and Electronic Systems, Volume 36, issue 2, April 2000, Page 407-421

SUMMARY OF THE INVENTION

Technical Problem

As a shape of a periodic pulse train, there is a shape called a staggered pulse. The staggered pulse is a periodic pulse train in which a plurality of pulses appear at short intervals for each specific cycle. In the staggered pulse, the number of pulses appearing for each certain cycle is referred to as a stagger level.

In conventional methods, a cycle can be correctly estimated when a stagger level is low, but there is a problem that it is difficult to extract a cycle when the stagger level increases. This is because the random noise threshold value of PRI conversion simply increases in proportion to the number of pulses without depending on pulse arrangement and thus the threshold value also increases along with the increase in the stagger level. Accordingly, it is desirable to correctly extract a cycle even when the stagger level is high.

An object of the present invention devised in view of the aforementioned circumstance is to provide a pulse train signal cycle estimation device, a pulse train signal cycle estimation method, and a pulse train signal cycle estimation program which can correctly extract a cycle of a pulse train signal even when a stagger level is high.

Means for Solving the Problem

To solve the aforementioned problems and accomplish the object, a pulse train signal cycle estimation device of the present invention includes: an extraction unit which extracts a candidate cycle that is a cycle determination target from an input time-series pulse train; an analysis unit which converts arrangement of the time-series pulse train into numerical values on the basis of the extracted candidate cycle and outputs a constant that adjusts a random noise threshold value of PRI conversion in response to an index indicating a degree of concentration of calculated numerical values; and a detection unit which executes PRI conversion using a value of the candidate cycle and the constant and performs cycle determination and cycle value detection.

Advantageous Effects of Invention

According to the present invention, it is possible to correctly extract a cycle of a pulse train signal even when a stagger level is high.

DESCRIPTION OF EMBODIMENTS

Hereinafter, an embodiment of a pulse train signal cycle estimation device, a pulse train signal cycle estimation method, and a pulse train signal cycle estimation program disclosed by the present application will be described in detail on the basis of the drawings. Meanwhile, this embodiment does not limit the pulse train signal cycle estimation device, the pulse train signal cycle estimation method, and the pulse train signal cycle estimation program according to the present application.

EMBODIMENT

In the following embodiment, a configuration of a cycle estimation device 10 according to the embodiment and a flow of processing of the cycle estimation device 10 will be sequentially described and finally effects according to the embodiment will be described.

[Configuration of Cycle Estimation Device]

Figure 1:
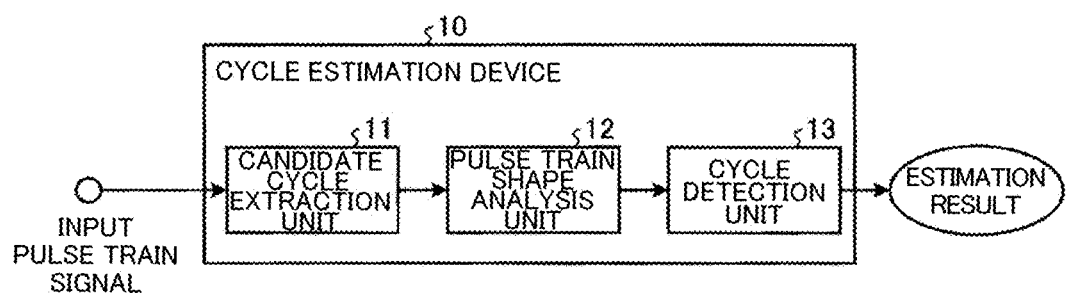
FIG. 1 is a block diagram illustrating an example of a configuration of a cycle estimation device according to an embodiment.

First, the configuration of the cycle estimation device 10 will be described using FIG. 1. FIG. 1 is a block diagram illustrating an example of the configuration of the cycle estimation device according to an embodiment. The cycle estimation device 10 according to the present embodiment extracts a candidate cycle that is a cycle determination target from an input time-series pulse train. The cycle estimation device 10 determines whether the time-series pulse train is periodically arranged or randomly arranged before execution of PRI conversion. Then, when it is determined that the time-series pulse train is periodically arranged, the cycle estimation device 10 decreases a random noise threshold value of PRI conversion such that a correct cycle can be extracted even when a stagger level is high.

As illustrated in FIG. 1, the cycle estimation device 10 includes a candidate cycle extraction unit 11 (extraction unit), a pulse train shape analysis unit 12 (analysis unit), and a cycle detection unit 13 (detection unit). Meanwhile, the cycle estimation device 10 may be realized, for example, by a computer that a read only memory (ROM), a random access memory (RAM), a central processing unit (CPU), and the like reading a predetermined program and the CPU executing the predetermined program.

Further, as illustrated in FIG. 1, a time-series pulse train signal is input to the cycle estimation device 10. For example, the cycle estimation device 10 may estimate a communication cycle of a network apparatus on the basis of the time-series pulse train signal.

An example of an implementation situation assumed in the present embodiment is as follows. A network apparatus A causes communication to occur every about 2400 seconds. Further, the network apparatus A transmits 15 or more packets at short intervals for one cycle. In addition, a network apparatus B causes communication to occur at an almost random timing. The cycle estimation device 10 performs cycle analysis on the network apparatus A and the network apparatus B using the same method and the same parameter settings, correctly estimates a communication cycle of the network apparatus A, and performs estimation regarding communication of the network apparatus B as being aperiodic. Here, since the cycle estimation device 10 does not erroneously extract a cycle from random communication, it is necessary to set a threshold value for the original random noise of PRI conversion to be equal to or greater than a certain value.

The candidate cycle extraction unit 11 receives input of a time-series pulse train and extracts a candidate cycle that is a cycle determination target from the input time-series pulse train. Meanwhile, the cycle estimation device 10 may acquire packet data in a network, such as a communication log, as the time-series pulse train, for example, and convert the packet data into a time-series pulse train at a communication occurrence time.

The pulse train shape analysis unit 12 converts arrangement of the time-series pulse train into numerical values on the basis of the extracted candidate cycle and outputs a constant C that adjusts a random noise threshold value of PRI conversion in response to an index indicating a degree of concentration of calculated numerical values.

Figure 2:
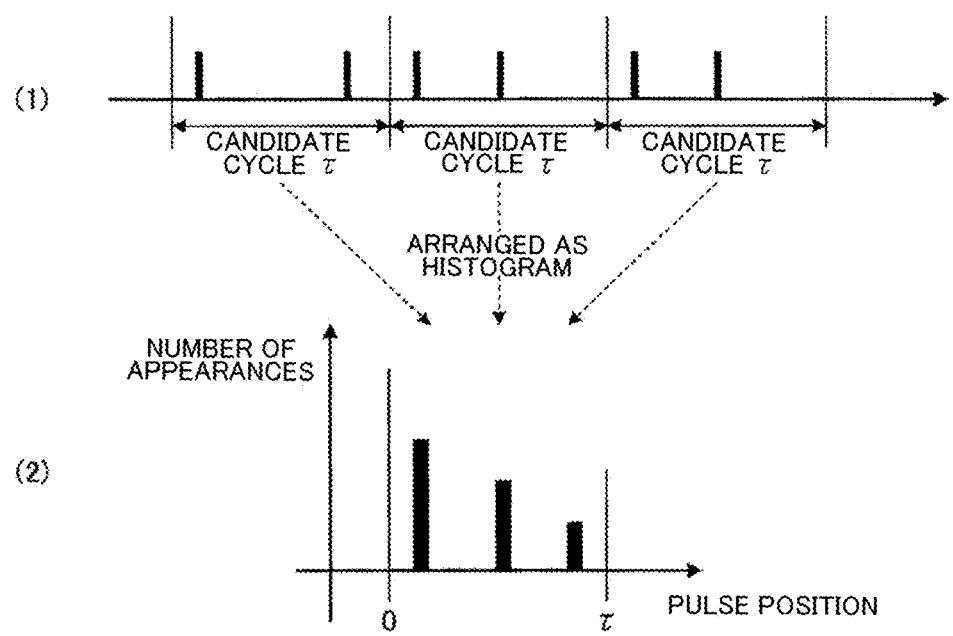
FIG. 2 is a diagram for describing processing of a pulse train shape analysis unit.

FIG. 2 is a diagram for describing processing of the pulse train shape analysis unit 12. First, as illustrated in FIG. 2, a value of a candidate cycle that is a determination target is set to τ, and a histogram having a horizontal axis range of 0 to τ and a bin size of τ/n (n is an integer equal to or greater than 1) is conceived.

The pulse train shape analysis unit 12 divides an input time-series pulse train into values τ of a candidate cycle and rearranges the time-series pulse train as a histogram having horizontal axis values of 0 to τ and a bin size of τ/n (refer to (1) of FIG. 2).

Then, the pulse train shape analysis unit 12 performs processing of reading values of pulse positions from the histogram and adding the number of appearances of the values of the pulse positions to a corresponding bin of the histogram with respect to the entire divided input data. That is, the pulse train shape analysis unit 12 reads values of pulse positions in the divided data and adds the number of appearances to the corresponding bin of the prepared histogram (refer to (2) of FIG. 2). When one bin includes a plurality of pulses as a result of changing a bin size to τ/n, the pulse train shape analysis unit 12 adds all the number of pulses included in the bin to the histogram.

Then, the pulse train shape analysis unit 12 calculates an index indicating a degree of concentration after completion of addition to the histogram for the entire divided data. As the index indicating the degree of concentration, a value of a hoover index is calculated. The hoover index is used as an index indicating a degree of urban population concentration. A hoover index value is an index that becomes closer to 0 when the appearance frequency of each value in a histogram becomes more uniform and becomes closer to 1 when the appearance frequency concentrates more on one value. The pulse train shape analysis unit 12 calculates the hoover index value (H.I.) using Equation (1).

[Math. 1]

$$H.I. = \frac{1}{2}\sum_{i=1}^{\tau} |x_i - n| \quad (1)$$

In Equation (1), $x_i$ is a value obtained by dividing the number of appearances of an i-th value in the histogram by a total value of the numbers of appearances of values of the histogram. n is an integer equal to or greater than 1 as described above.

When H.I. exceeds a predetermined threshold value, the pulse train shape analysis unit 12 determines that pulses are periodically arranged and outputs the constant C for decreasing the random noise threshold value of PRI conversion. This threshold value is arbitrarily set. The constant C is a value of 0 to 1. Specifically, the pulse train shape analysis unit 12 sets a value obtained by subtracting H.I. from 1 as C when H.I. is equal to or less than a specific value (e.g., 0.3). On the other hand, when H.I. is equal to or greater than a predetermined threshold value, the pulse train shape analysis unit 12 does not output the constant C.

The cycle detection unit 13 executes PRI conversion using the value of the candidate cycle and the constant C and performs cycle determination and cycle value detection. Here, when the constant C is output from the pulse train shape analysis unit 12, the cycle detection unit 13 sets a value obtained by multiplying the random noise threshold value of PRI conversion by the constant C as a new random noise threshold value.

[Processing Procedure of Pulse Train Signal Cycle Estimation Processing]

Figure 3:
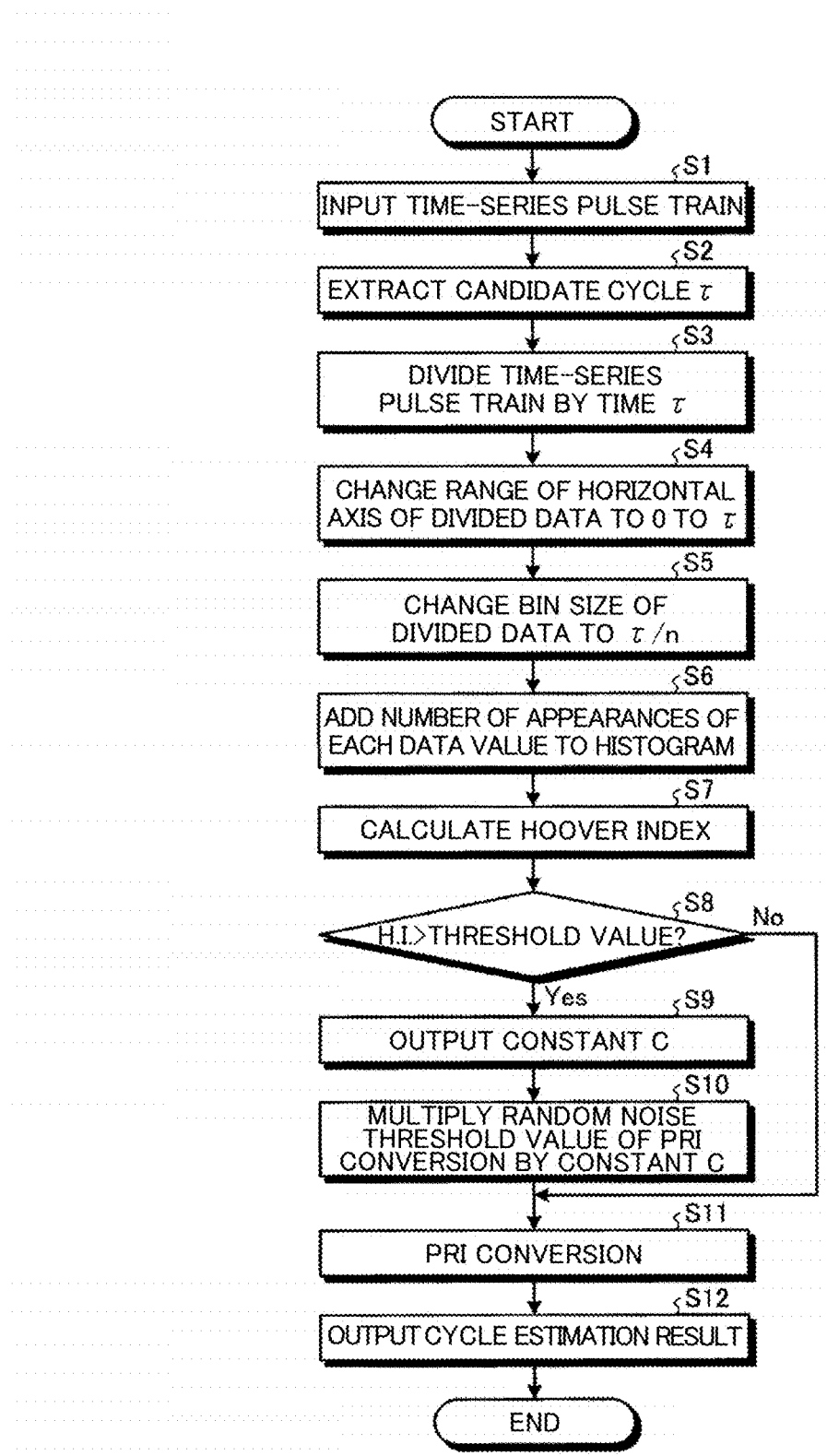
FIG. 3 is a flowchart illustrating a processing procedure of pulse train signal cycle estimation processing according to an embodiment.

Next, a processing procedure of pulse train signal cycle estimation processing according to an embodiment will be described. FIG. 3 is a flowchart illustrating a processing procedure of the pulse train signal cycle estimation processing according to an embodiment.

As illustrated in FIG. 3, the candidate cycle extraction unit 11 receives input of a time-series pulse train (step S1) and extracts a candidate cycle τ that is a cycle determination target from the input time-series pulse train (step S2).

The pulse train shape analysis unit 12 divides the input time-series pulse train into candidate cycle values τ (step S3). The pulse train shape analysis unit 12 changes the range of the horizontal axis of the divided data to 0 to τ (step S4). The pulse train shape analysis unit 12 changes a bin size of the divided data to τ/n (step S5). Then, the pulse train shape analysis unit 12 adds the number of appearances of each data value to a histogram (step S6).

The pulse train shape analysis unit 12 calculates a hoover index value (H.I.) using Equation (1) with respect to the entire divided data (step S7). Then, the pulse train shape analysis unit 12 determines whether H.I. exceeds a threshold value (step S8).

The pulse train shape analysis unit 12 outputs the constant C (step S9) when H.I. exceeds the threshold value (Yes in step S8). The cycle detection unit 13 sets a value obtained by multiplying the random noise threshold value of PRI conversion by the constant C output from the pulse train shape analysis unit 12 as a new random noise threshold value (step S10).

When H.I. does not exceed the threshold value (No in step S8) or after step S10 ends, the cycle detection unit 13 executes PRI conversion (step S11) and performs cycle determination and cycle value detection. Then, the cycle detection unit 13 outputs a cycle estimation result (step S12) and ends processing.

Effects of Embodiment

The cycle estimation device 10 extracts candidate cycle that is a cycle determination target from a time-series pulse train. In addition, the cycle estimation device 10 converts arrangement of the time-series pulse train into numerical values on the basis of the extracted candidate cycle and outputs a constant that adjusts the random noise threshold value of PRI conversion in response to an index indicating a degree of concentration of the calculated numerical values. Further, the cycle estimation device 10 executes PRI conversion using the value of the candidate cycle and the constant and performs cycle determination and cycle value detection. As a result, it is possible to correctly extract a cycle of a pulse train signal of PRI conversion even when a stagger level is high because the cycle estimation device 10 adjusts the random noise threshold value and executes PRI conversion using the constant output in response to a degree of concentration of the numerical values converted from arrangement of the time-series pulse train.

In addition, the cycle estimation device 10 divides the time-series pulse train into candidate cycle values τ and rearranges the time-series pulse train as a histogram having horizontal axis values of 0 to τ and a bin size of τ/n. Further, the cycle estimation device 10 performs processing of reading pulse position values from the histogram and adding the numbers of appearances of the pulse position values to corresponding bins of the histogram for the entire divided input data. By performing this processing, the cycle estimation device 10 can appropriately perform addition to the histogram with respect to the entire divided data.

Then, the cycle estimation device 10 calculates a hoover index value as an index indicating a degree of concentration and outputs the constant C when the hoover index value exceeds a predetermined threshold value. Accordingly, the cycle estimation device 10 determines that pulses are periodically arranged and outputs the constant C that adjusts the random noise threshold value of PRI conversion such that the random noise threshold value of PRI conversion can be adjusted when the hoover index value exceeds the predetermined threshold value.

In addition, the constant C is a constant for decreasing the random noise threshold value of PRI conversion. Accordingly, the cycle estimation device 10 can decrease the random noise threshold value by setting a value obtained by multiplying the random noise threshold value of PRI conversion by the constant C as a new random noise threshold value when the constant C is output.

That is, the cycle estimation device 10 determines whether the input time-series pulse train is periodically arranged or randomly arranged before PRI conversion is executed. Then, the cycle estimation device 10 decreases the random noise threshold value of PRI conversion upon determining that the input time-series pulse train is periodically arranged such that correct cycle extraction can be performed even when a stagger level is high.

[System Configuration and the Like]

Each component of each device illustrated in the drawings is functionally conceptual and need not necessarily be physically configured as illustrated. That is, specific forms of distribution and integration of devices are not limited to those illustrated and all or some can be configured by being functionally or physically distributed or combined in arbitrary units depending on various loads, use situation, and the like. Further, all or an arbitrary number of processing functions executed in each device can be realized by a CPU and a program analyzed and executed by the CPU or realized by hardware according to a wired logic.

In addition, all or some types of processing described as automatically executed processing among processing described in the present embodiment can be manually performed, or all or some types of processing described as manually executed processing can be automatically performed through a known method. In addition, processing procedures, control procedures, specific names, and information including various types of data and parameters illustrated in the above document and figures can be arbitrarily changed unless otherwise mentioned.

[Program]

Figure 4:
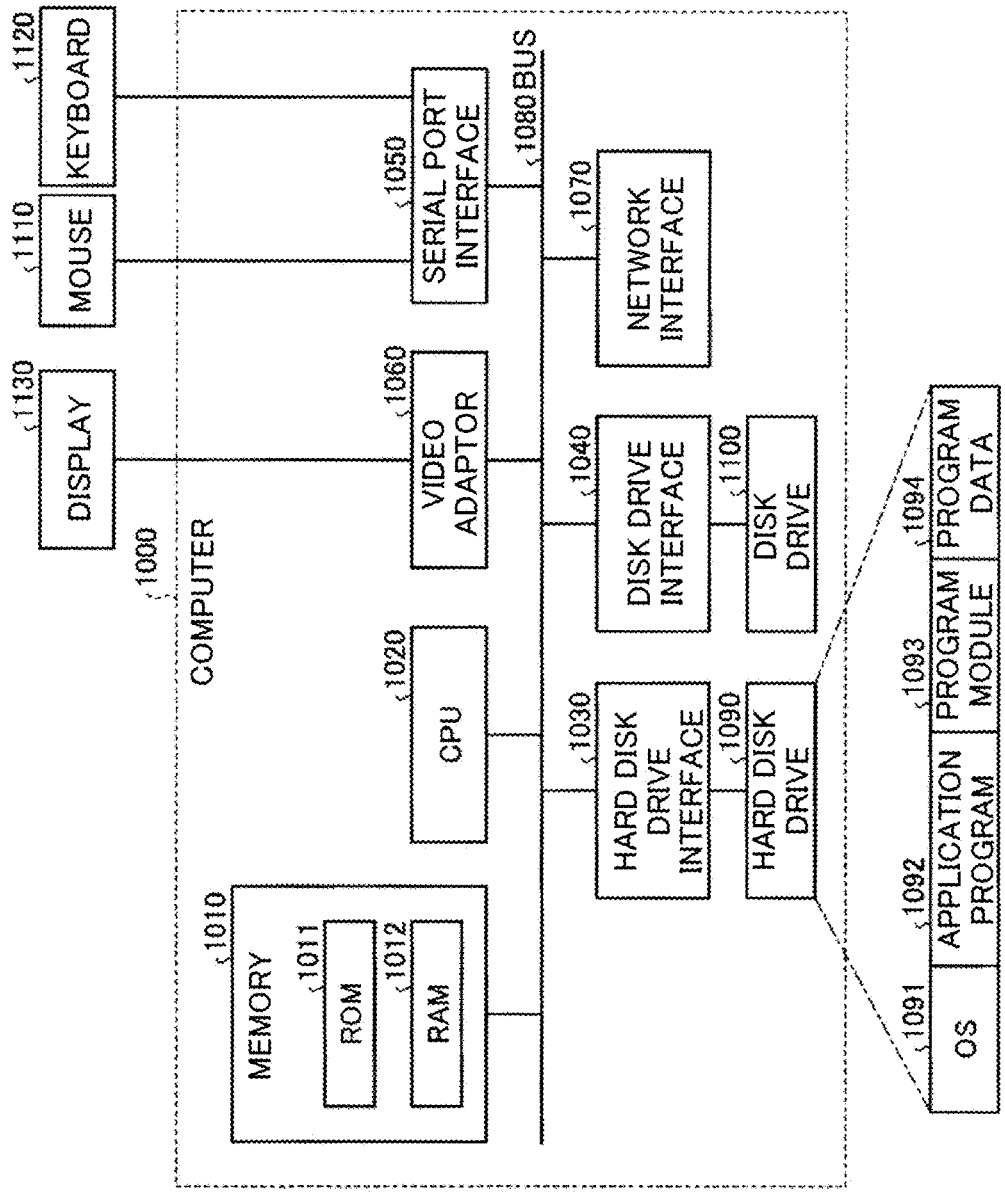
FIG. 4 is a diagram illustrating an example of a computer in which a cycle estimation device is realized according to execution of a program.

FIG. 4 is a diagram illustrating an example of a computer realizing the cycle estimation device 10 by executing a program. The computer 1000 may include, for example, a memory 1010 and a CPU 1020. In addition, the computer 1000 includes a hard disk drive interface 1030, a disk drive interface 1040, a serial port interface 1050, a video adaptor 1060, and a network interface 1070. These parts are connected through a bus 1080.

The memory 1010 includes a ROM 1011 and a RAM 1012. The ROM 1011 may store, for example, a boot program such as a basic input output system (BIOS). The hard disk drive interface 1030 is connected to a hard disk drive 1090. The disk drive interface 1040 is connected to a disk drive 1100. For example, removable storage media such as a magnetic disk and an optical disc may be inserted into the disk drive 1100. The serial port interface 1050 may be connected to a mouse 1110 and a keyboard 1120, for example. The video adaptor 1060 may be connected to a display 1130, for example.

The hard disk drive 1090 may store, for example, an operating system (OS) 1091, an application program 1092, a program module 1093, and program data 1094. That is, a program that defines each type of processing of the cycle estimation device 10 is mounted as the program module 1093 in which computer-executed code is described. The program module 1093 may be stored, for example, in the hard disk drive 1090. For example, the program module 1093 for executing the same processing as a functional configuration in the cycle estimation device 10 is stored in the hard disk drive 1090. Meanwhile, the hard disk drive 1090 may be replaced with a solid state drive (SSD).

In addition, setting data used in processing of the above-described embodiment is stored as the program data 1094 in the memory 1010 or the hard disk drive 1090, for example. Then, the CPU 1020 reads the program module 1093 and the program data 1094 stored in the memory 1010 and the hard disk drive 1090 to the RAM 1012 and executes them as necessary.

Meanwhile, the program module 1093 and the program data 1094 are not limited to cases in which they are stored in the hard disk drive 1090 and may be stored in removable storage media, for example, and read by the CPU 1020 through the disk drive 1100 or the like. Alternatively, the program module 1093 and the program data 1094 may be stored in other computers connected through a network (a LAN, a wide area network (WAN), or the like). In addition, the program module 1093 and the program data 1094 may be read by the CPU 1020 from other computers through the network interface 1070.

Although an embodiment to which the invention is applied by the present inventor has been described above, the present invention is not limited by the description and drawings that form a part of the disclosure of the present invention according to the present embodiment. That is, all other embodiments, implemented forms, operation technology, and the like achieved by those skilled in the art on the basis of the present embodiment are included in the scope of the present invention.

REFERENCE SIGNS LIST

10 Cycle estimation device
11 Candidate cycle extraction unit
12 Pulse train shape analysis unit
13 Cycle Detection Unit

The invention claimed is:

1. A pulse train signal cycle estimation device comprising:
   extraction circuitry which extracts a candidate cycle that is a cycle determination target from an input time-series pulse train;
   analysis circuitry which converts an arrangement of the time-series pulse train into numerical values on the basis of the extracted candidate cycle and outputs a constant that adjusts a random noise threshold value of pulse repetition interval (PRI) conversion in response to an index indicating a degree of concentration of calculated numerical values; and
   detection circuitry which executes PRI conversion using a value of the candidate cycle and the constant and performs cycle determination and cycle value detection.

2. The pulse train signal cycle estimation device according to claim 1, wherein:
   the analysis circuitry divides the time-series pulse train into values $\tau$ of the candidate cycle, rearranges the time-series pulse train as a histogram having horizontal axis values of 0 to $\tau$ and a bin size of $\tau/n$, n is an integer equal to or greater than 1, and performs processing of reading pulse position values from the histogram and adding numbers of appearances of the pulse position values to corresponding bins of the histogram for the entire divided input data.

3. The pulse train signal cycle estimation device according to claim 1, wherein:
   the analysis circuitry calculates a hoover index value as the index indicating the degree of concentration and outputs the constant when the hoover index value exceeds a predetermined threshold value.

4. The pulse train signal cycle estimation device according to claim 1, wherein:
   the constant is a constant for decreasing the random noise threshold value of PRI conversion, and the detection circuitry sets a value obtained by multiplying the random noise threshold value of PRI conversion by the constant as a new random noise threshold value when the constant is output from the analysis circuitry.

5. A pulse train signal cycle estimation method, comprising:
   extracting a candidate cycle that is a cycle determination target from an input time-series pulse train;
   converting an arrangement of the time-series pulse train into numerical values on the basis of the extracted candidate cycle and outputting a constant that adjusts a random noise threshold value of pulse repetition interval (PRI) conversion in response to an index indicating a degree of concentration of calculated numerical values; and
   executing PRI conversion using a value of the candidate cycle and the constant and performing cycle determination and cycle value detection.

6. A non-transitory computer readable medium including a pulse train signal cycle estimation program for causing a computer to execute:
   extracting a candidate cycle that is a cycle determination target from an input time-series pulse train;
   converting an arrangement of the time-series pulse train into numerical values on the basis of the extracted candidate cycle and outputting a constant that adjusts a random noise threshold value of pulse repetition interval (PRI) conversion in response to an index indicating a degree of concentration of calculated numerical values; and
   executing PRI conversion using a value of the candidate cycle and the constant and performing cycle determination and cycle value detection.

\* \* \* \* \*